United States Patent [19]

Streit et al.

[11] Patent Number: 5,631,477
[45] Date of Patent: May 20, 1997

[54] QUATERNARY COLLECTOR INALAS-INGAALAS HETEROJUNCTION BIPOLAR TRANSISTOR

[75] Inventors: Dwight C. Streit, Seal Beach; Aaron K. Oki; Liem T. Tran, both of Torrance, all of Calif.

[73] Assignee: TRW Inc., Redondo Beach, Calif.

[21] Appl. No.: 490,440

[22] Filed: Jun. 2, 1995

[51] Int. Cl.$^6$ .................. H01L 31/0328; H01L 31/0336
[52] U.S. Cl. ........................................... 257/197; 257/198
[58] Field of Search ................................. 257/197, 198, 257/201

[56] References Cited

U.S. PATENT DOCUMENTS

| | | | |
|---|---|---|---|
| 3,748,480 | 7/1973 | Coleman | 257/184 |
| 4,719,155 | 1/1988 | Matsumoto | 257/184 |
| 4,794,440 | 12/1988 | Capasso et al. | 257/197 |
| 4,821,082 | 4/1989 | Frank | 257/197 |
| 4,868,418 | 9/1989 | Imamura et al. | 307/362 |
| 4,958,208 | 9/1990 | Tanaka | 257/197 |
| 5,019,890 | 5/1991 | Ishibashi et al. | 257/197 |
| 5,034,783 | 7/1991 | Chang et al. | 257/184 |
| 5,079,184 | 1/1992 | Hatano et al. | 437/107 |
| 5,150,185 | 9/1992 | Yamada | 257/197 |
| 5,153,693 | 10/1992 | Tsang et al. | 257/197 |
| 5,168,077 | 12/1992 | Ashizawa et al. | 437/107 |
| 5,171,697 | 12/1992 | Liu et al. | 437/31 |
| 5,179,037 | 1/1993 | Seabaugh | 437/127 |
| 5,204,284 | 4/1993 | Kuo et al. | 257/198 |
| 5,270,223 | 12/1993 | Liu | 257/198 |
| 5,284,783 | 2/1994 | Ishikawa et al. | 257/198 |
| 5,336,909 | 8/1994 | Katoh et al. | 257/197 |
| 5,345,097 | 9/1994 | Nakagawa | 257/198 |
| 5,448,087 | 9/1995 | Streit et al. | 257/198 |

OTHER PUBLICATIONS

Su, L.M. et al. "*NpnN* double–heterojunction bipolar transistor on InGaAsP/InP," Appl. Phys. Lett. 47:1, pp. 28–30 (1985).

Vlcek, J.C. et al. "Multiply–Graded InGaAlAs Heterojunction Bipolar Transistors," Electronics Letters 27:13, pp. 1213–1215 (1991).

Nottenburg, Richard N. et al. "High–Speed InGaAs(P)/InP Double–Heterostructure Bipolar Transistors," IEEE, 8:6, pp. 282–284 (1987).

Hafizi, M. et al. "High–Performance Microwave Power AlInAs/GaInAs/InP Double Heterojunction Bipolar Transistors with Compositionally Graded Base–Collector Junction," IEEE pp. 32.3.1–32.3.4 (1993).

Farley, C.W. et al. "Performance tradeoffs in AlInAs/GaInAs single–and double–heterojunction *NpN* heterojunction bipolar transistors," J. Vac. Sci. Technol. B 10(2), pp. 1023–1025 (1992).

Malik, R.J. et al. "High–Gain $Al_{0.48}In_{0.52}As/Ga_{0.53}As$ Vertical n–p–n Heterojunction Bipolar Transistors Grown by Molecular–Beam Epitaxy," IEEE, pp. 2383–2388 (1983).

Miura, A. et al. "InAlGaAs/InGaAs HBT," IEEE pp. 4.3.1–4.3.5 (1992).

Stanchina, W.E., et al. "Status and Potential of AlInAs/GaInAs/InP HBT ICs," pp. 434–437.

Malik, Roger J. et al. "Temperature Dependence of Common–Emitter *I–V* and Collector Breakdown Voltage Characteristics in AlGaAs/GaAs and AlInAs/GaInAs HBT's Grown by MBE," IEEE, 13:11, pp. 557–563 (1992).

(List continued on next page.)

Primary Examiner—Wael Fahmy
Attorney, Agent, or Firm—Michael S. Yatsko

[57] ABSTRACT

An InAlAs/InGaAlAs heterojunction bipolar transistor that includes a constant quaternary InGaAlAs collector layer. Graded InGaAlAs collector layers are provided on each side of the quaternary collector layer to minimize transitions through the constant collector layer. The InAlAs/InGaAlAs HBT may also include one or more of a graded InGaAlAs emitter-base transition region, a graded-doping InGaAs base layer, and a graded-composition InGaAlAs base layer.

17 Claims, 6 Drawing Sheets

OTHER PUBLICATIONS

Ritter, D. et al. "Anomalous electric field and temperature dependence of collector multiplication in InP/Ga$_{0.47}$In$_{0.53}$As heterojunction bipolar transistors," Appl. Phys. Lett. 60:25, pp. 3150–3152 (1992).

Feygenson, A. et al. "A 144 GHz InP/InGaAs Composite Collector Heterostructure Bipolar Transistor," IEEE pp. 4.2.1–4.2.4 (1992).

Yamada, H. et al. "InAlAs/InGaAs Double Heterojunction Bipolar Transistors with a Collector Launcher Structure for High–Speed ECL Applications," IEDM, pp. 31.7.1 (1991).

Vlcek, James C. et al. "Techniques and applications of graded–composition InGaAlAs alloys," J. Vac. Sci. Technol. B 10:2, pp. 822–824 (1992).

Tran, Liem et al. "InAlAs/InGaAs HBT with Exponentially Graded Base Doping and Graded InGaAlAs Emitter–Base Junction," pp. 438–441.

QUATERNARY COLLECTOR INALAS-INGAALAS HETEROJUNCTION BIPOLAR TRANSISTOR

BACKGROUND OF THE INVENTION

1. Field of the Invention

This invention relates generally to a heterojunction bipolar transistor and, more particularly, to an InAlAs/InGaAlAs heterojunction bipolar transistor that includes a constant InGaAlAs quaternary collector layer, a graded-composition InGaAlAs emitter-base transition region, a graded-doping InGaAs base layer and/or a graded-composition InGaAlAs base layer.

2. Discussion of the Related Art

Because of certain known device performance advantages, heterojunction bipolar transistors (HBTs) are desirable for many applications, especially high power and high frequency microwave applications. Early HBTs were generally gallium arsenide/aluminum gallium arsenide (GaAs/AlGaAs) HBTs. As device performance demands increased, GaAs/AlGaAs HBTs were limited in their ability to provide high enough frequency performance, acceptable cut-off frequency ($f_T$) and high enough gain for amplifying purposes. In order to overcome these limitations, indium gallium arsenide/indium aluminum arsenide (InGaAs/InAlAs) HBTs that were matched to indium phoside (InP) substrates were devised. The advantages of the InAlAs/InGaAs HBTs over the GaAs/AlGaAs HBTs included higher electron saturation velocity and mobility, lower turn-on voltages, and larger bandgap discontinuity that provided high frequency performance advantages. However, original InAlAs/InGaAs HBTs suffered from a low collector breakdown voltage ($BV_{CEO}$) and high output conductance that limited their use in high frequency microwave applications. In a typical example, an InGaAs collector had a bandgap of 0.75eV as compared with a GaAs collector having a bandgap of 1.45eV in an AlGaAs/GaAs HBT. Further, InGaAs/InAlAs HBTs experience a decrease in collector breakdown voltage $BV_{CEO}$ with increasing temperature.

A number of different concepts have been put forward in order to provide an acceptable collector breakdown voltage $BV_{CEO}$ and output conductance for InAlAs/InGaAs HBTs. For example, InAlAs/InGaAs HBTs have been developed that have collector layers of InP. See for example Stanchina, W.E., "Status and Potential of AlInAs/GaInAs/InP HBT ICs," Proc. Fourth Int. Conf. Indium Phosphide and Related Materials, pp. 434–447 (1992) and Nottenburg, R.N. et al, "High-speed InGaAs(P)/InP double-heterostructure bipolar transistors," IEEE Electron Device Lett., vol. EDL-8, pp. 282–284 (1983). Additionally, InAlAs/InGaAs HBTs having InAlAs collector layers have also been provided. See for example, Farley, C. W. et al. "Performance tradeoffs in AlInAs/GaInAs single-and double-heterojunction NPN heterojunction bipolar transistors," J. Vac. Sci. Technol., vol. B10, pp. 1023–1025 (1992). One reference has reported use of a graded InGaAlAs collector layer in an InAlAs/InGaAs HBT. See Vlcek, J. C. et al. "Multiply—graded InGaAs heterojunction bipolar transistors," Electron Lett., vol. 27, pp. 1213–1215 (1991). Further, composite InGaAs/InP collectors in HBTs have also been reported. The use of InP or composite InGaAs/InP collectors has been limited, however, because the growth of phosphorous based compounds is not compatible with most solidsource molecular beam epitaxial (MBE) systems. U.S. Pat. No. 5,150,185 issued Sep. 22, 1992 to Yamada discloses an HBT semiconductor device that appears to include a quaternary $(InGaAs)_{0.4}(InAlAs)_{0.6}$ collector layer positioned between two n-type $(InGaAs)_{1-x}(InAlAs)_x$ graded layers.

Although recent semiconductor HBT devices have had some success in providing low collector breakdown voltages and high output conductances, while at the same time providing high frequency performance, acceptable cut-off frequencies and high gain, other device criteria are also important for realizing increased device performance. For example, it is important that HBT devices have high base electron transit times so as to increase the switching speed and frequency of the device. U.S. patent application Ser. No. 07/876,199, filed Apr. 30, 1992, titled "Heterojunction Bipolar Transistor with Graded Base Doping" and assigned to the assignee of the instant application, discloses a heterojunction bipolar transistor that has graded base doping so as to increase the base transit time of the device. However, this is a GaAs/AlGaAs HBT device, and thus suffers from its ability to provide high frequency performance, etc., as discussed above. Also, U.S. Pat. No. 5,284,783 issued Feb. 8, 1994 to Ishikawa et al. discloses a heterojunction bipolar transistor that includes a graded InGaAlAs base layer and a graded InGaAlAs emitter-base transition layer.

What is needed is a high performance HBT that does not suffer from a low collector breakdown voltage or high output conductance, and offers other device performance capabilities, such as increased base transit times, for high power applications. It is therefore an object of the present invention to provide such a device.

SUMMARY OF THE INVENTION

In accordance with the teachings of the present invention, an InAlAs/InGaAlAs HBT is disclosed that includes a constant quarternary InGaAlAs collector layer. The constant quarternary InGaAlAs collector layer allows for high frequency performance as well as high collector breakdown voltages and output conductances. Graded InGaAlAs collector layers are positioned on each side of the constant InGaAlAs collector layer to minimize transitions through the constant collector layer. The InAlAs/InGaAlAs HBT may also include one or more of a graded InGaAlAs emitter-base transition region, a graded-doping InGaAs base layer, and a graded-composition InGaAlAs base layer. The graded emitter-base transition region reduces the transition between the emitter and base layers of the HBT and the graded-doping and graded-composition base layer provide for increased base transit times.

Additional objects, advantages and features of the present invention will become apparent from the following description and appended claims, taken in conjunction with the accompanying drawings.

DETAILED DESCRIPTION OF THE PREFERRED EMBODIMENTS

The following discussion of the preferred embodiments concerning an InAlAs/InGaAlAs HBT semiconductor device is merely exemplary in nature and is not intended to limit the invention or its applications or uses.

In accordance with the teachings of the present invention, a constant quarternary InGaAlAs collector layer in an HBT is proposed rather than the known InGaAs collector layer which exhibits low collector breakdown voltages, or the known InAlAs collector layer which exhibits undesirable current blocking as a result of the InGaAs/InAlAs interface of the base and collector layers of the HBT. This satisfies the above described problem concerning low collector breakdown voltage and high output conductance generally present in known InAlAs/InGaAs HBTs. Further, the semiconductor device of the invention may include one or more of a graded-composition InGaAlAs base layer, a graded InGaAlAs emitter-base transition region, and a graded-doping InGaAs base layer.

Figure 1:
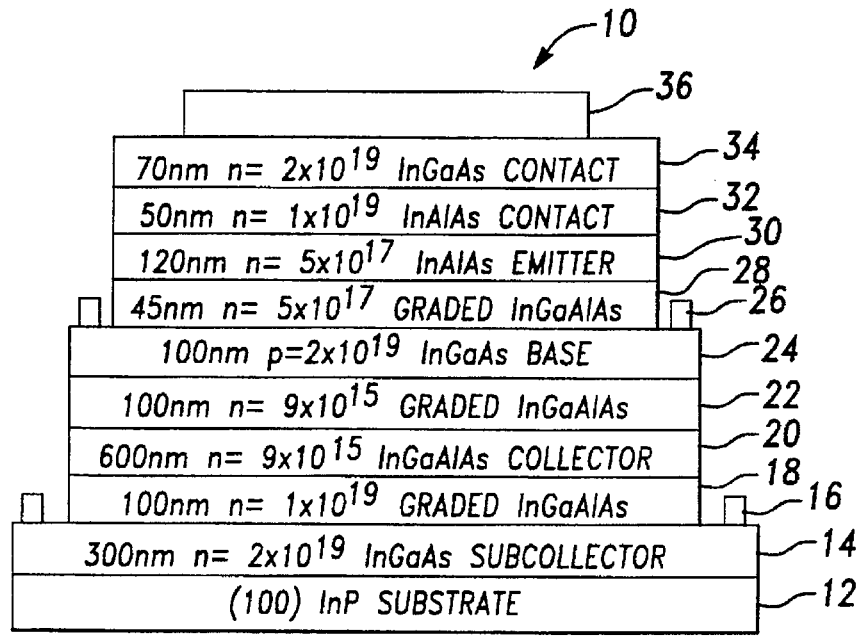
FIG. 1 is a profile view of an InAlAs/InGaAlAs HBT including a quarternary InGaAlAs collector layer and a graded InGaAlAs emitter-base transition region according to an embodiment of the present invention.

FIG. 1 shows a profile view of an HBT 10 according to an embodiment of the present invention. The HBT 10 is lattice matched to an InP substrate 12 where each layer is grown by a molecular beam epitaxy growth process well understood in the art. In one example, the device material was grown by solid-source MBE using cracked arsenic, where silicon was used for the n-type doping material and beryllium was used for the p-type doping material. Of course, other doping materials, other layer thicknesses, other layer structures, etc., than those set out below can be provided without departing from the scope of the invention. The different layers of the HBT 10 were appropriately patterned and etched by an applicable process that would be well understood to one skilled in the art.

An n-type $In_{0.53}Ga_{0.47}As$ subcollector layer 14 doped to about $2 \times 10^{19}$ atoms/cm$^3$ is grown on the substrate 12 to a thickness of about 300 nm. As is well understood in the art, the composition of the As in these types of HBTs is generally 50%, and the remaining components, i.e., the In, Ga, and/or Al make up the remaining 50% of the composition. A pair of collector contacts 16 are evaporated and patterned on the subcollector layer 14 after the other layers are appropriately etched in a process that is well understood in the art. An n-type InGaAlAs graded collector layer 18 doped to about $1 \times 10^{19}$ atoms/cm$^3$ is grown on the subcollector layer 14 to a thickness of about 100 nm. In one embodiment, the graded layer 18 has a composition of $In_{0.53}Ga_{0.46}Al_{0.01}As$ adjacent the subcollector layer 14, and graded to have a composition of $In_{0.53}Ga_{0.24}Al_{0.23}As$ at a surface of the graded layer 18 opposite to the subcollector layer 14. An n-type $In_{0.53}Ga_{0.24}Al_{0.23}As$ quaternary collector layer 20 doped to about $1 \times 10^{15}$ atoms/cm$^3$ is grown on the graded layer 18 to a thickness of about 600 nm. An n-type InGaAlAs graded collector layer 22 doped to about $9 \times 10^{15}$ atoms/cm$^3$ is grown on the collector layer 20 to a thickness of about 100nm. The graded layer 22 has a composition of about $In_{0.53}Ga_{0.24}Al_{0.23}As$ at a surface adjacent to the collector layer 20, and is graded to have a composition of $In_{0.53}Ga_{0.46}Al_{0.01}As$ at a surface opposite to the collector layer 20. The increased bandgap of the quaternary collector layer 20 results in improved device performance without the bandgap being so large as to impede normal device performance.

A p-type $In_{0.53}Ga_{0.47}As$ base layer 24 doped to about $4 \times 10^{19}$ atoms/cm$^3$ is grown on the graded layer 22 to a thickness of about 100 nm. A base contact 26 is evaporated and patterned on the base layer 24 after the upper emitter layers have been deposited and etched in a process that is well understood to one skilled in the art. An n-type InGaAlAs graded emitter-base transition layer 28 doped to about $5 \times 10^{17}$ atoms/cm$^3$ is grown on the base layer 24 to a thickness of about 45 nm. The graded layer 28 has a composition of $In_{0.53}Ga_{0.37}Ga_{0.10}As$ at an interface between the graded layer 28 and the base layer 24, and is graded to have a composition of $In_{0.52}Ga_{0.01}Al_{0.47}As$ at a surface of the graded layer 28 opposite to the base layer 24. An n-type $In_{0.52}Al_{0.48}As$ emitter layer 30 doped to about $5 \times 10^{17}$ atoms/cm$^3$ is grown on the graded layer 28 to a thickness of about 120nm. An n-type $In_{0.52}Al_{0.48}As$ emitter contact layer 32 doped to about $1 \times 10^{19}$ atoms/cm$^3$ is grown on the emitter layer 30 to a thickness of about 50 nm. An n-type $In_{0.53}Ga_{0.47}As$ emitter contact layer 34 doped to about $2=10^{19}$ atoms/cm$^3$ is grown on the emitter contact layer 32 to a thickness of approximately 70nm. An emitter contact 36 is deposited and patterned on the emitter contact layer 34. Each of the thicknesses given above is by way of a non-limiting example in that other thicknesses for each layer within an operable range would be applicable within the scope of the invention.

Figure 2:
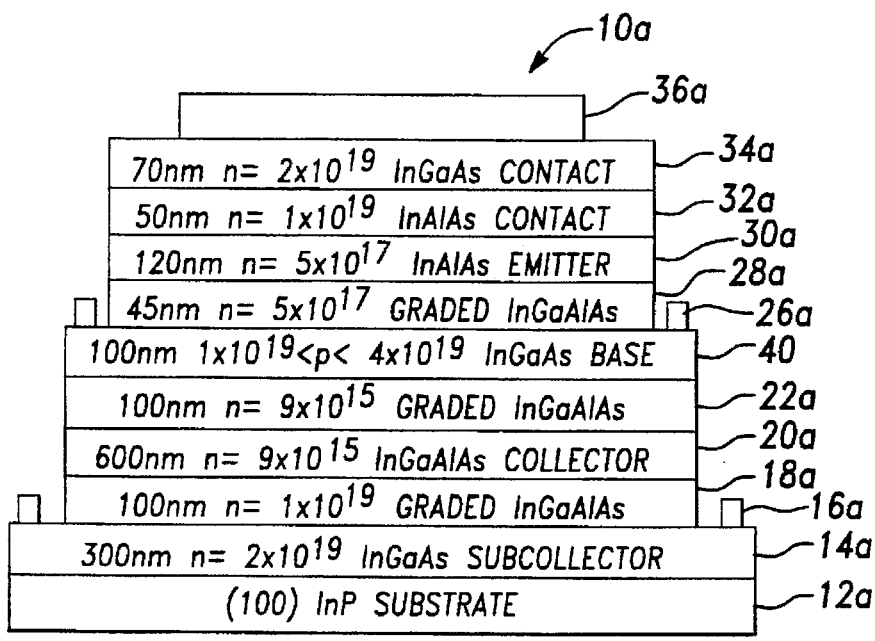
FIG. 2 is a profile view of an InAlAs/InGaAlAs HBT including a quarternary InGaAlAs collector layer and a graded doping InGaAs base layer according to an embodiment of the present invention.

FIG. 2 shows a profile view of an HBT 10a according to another embodiment of the present invention. The HBT 10a is similar to the HBT 10 of FIG. 1, however, the base layer 24 has been replaced with a graded-doped p-type InGaAs base layer 40. Because the remaining layers and contacts of the HBT 10a are the same as the corresponding layers and contacts of the HBT 10, these layers and contacts are labeled accordingly followed by the letter "a", and will not be specifically discussed. The base layer 40 is grown to a thickness of about 100 nm and has a doping concentration of approximately $1 \times 10^{19}$ atoms/cm$^3$ at an interface between the base layer 40 and the graded InGaAlAs collector layer 22a. The thickness of 100 nm is by way of a non-limiting example in that any operable thickness can be used. The base layer 40 is graded such that the p-type doping concentration of the base layer 40 at the interface of the graded InGaAlAs emitter layer 28a is about $4 \times 10_{19}$ atoms/cm$^3$. The graded doping profile alters the fermi level within the base layer 40 such that the conduction band has a decreasing slope from the emitter side of the base layer 40 to the collector side of the base layer 40 that aids electron transport through the base layer 40. The graded doping concentration of the p-type dopant atoms creates a smooth grading in the conduction band of the base that provides for a higher base transit time so as to increase the switching speed and frequency of the HBT 10a over the prior art HBTs.

Figure 3:
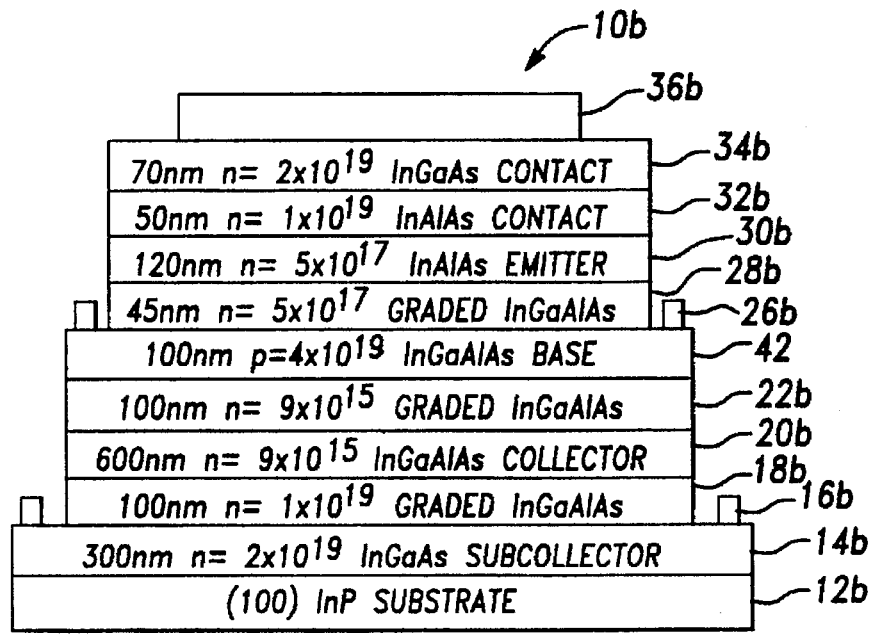
FIG. 3 is a profile view of an InAlAs/InGaAlAs HBT including a quarternary InGaAlAs collector layer and a graded-composition InGaAlAs base layer according to an embodiment of the present invention.

FIG. 3 shows a profile view of an HBT 10b according to another embodiment of the present invention. The HBT 10b is the same as the HBT 10 of FIG. 1 except that the base layer 24 has been replaced with a graded-composition InGaAlAs base layer 42. Because the remaining layers and contacts of the HBT 10b are the same as the layers and contacts of the HBT 10, these layers and contacts will not be specifically discussed, and will be referenced by a corresponding reference numeral to that of the HBT 10 followed by the letter "b". In one embodiment, it is the composition of the GaAl constituents of the InGaAlAs base layer 42 that is graded and the In and As constituents remain constant. The base layer 42 is graded such that the composition of the base layer 42 is about $In_{0.53}Ga_{0.46}Al_{0.01}As$ at an interface between the base layer 42 and the graded collector layer 22b, and the composition of the base layer 42 is $In_{0.53}Ga_{0.24}Al_{0.25}As$ at an interface between the base layer 42 and the emitter-base transition layer 28b. In this manner, the base layer 42 is graded from a low bandgap at the collector side of the base layer 42 to a high bandgap at the emitter side of the base layer 42 so as to create a built-in electric field in the base layer 42 that aids electron transport through the base layer 42.

Figure 4:
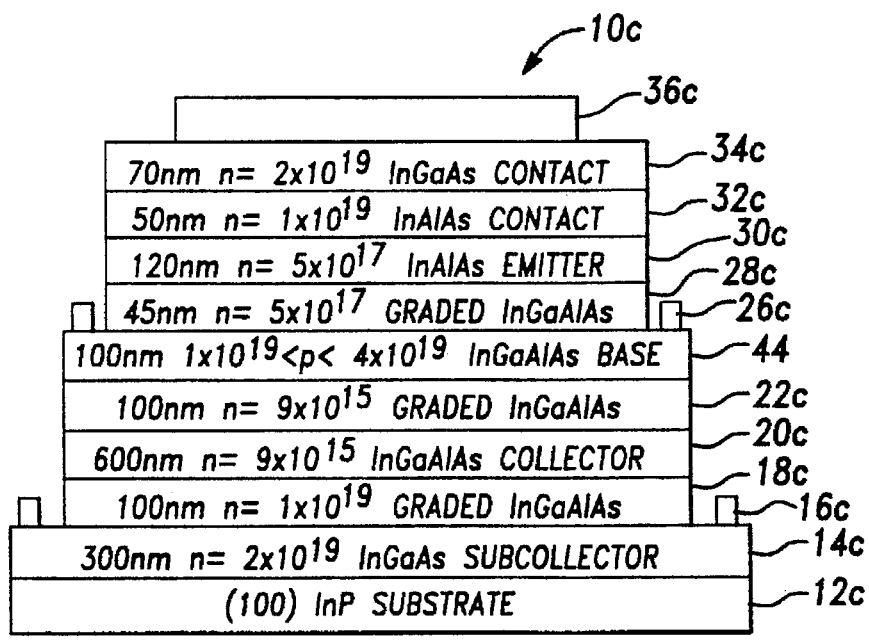
FIG. 4 is a profile view of an InAlAs/InGaAlAs HBT including a quarternary InGaAlAs collector layer and a graded-doping and graded-composition InGaAlAs base layer according to an embodiment of the present invention.

FIG. 4 shows a profile view of a combination of the HBTs 10a and 10b as an HBT 10c. Specifically, the graded-doping of the InGaAs base layer 40 of the HBT 10a has been combined with the graded-composition of the InGaAlAs base layer 42 of the HBT 10b to arrive at a base layer 44 that includes both a graded-doping concentration and a graded-composition having the doping and composition of that of the layers 40 and 42 discussed above. Therefore, the base transit time of the base layer 44 is even greater as a result of the change in the bandgap of the base layer 44.

Figure 5:
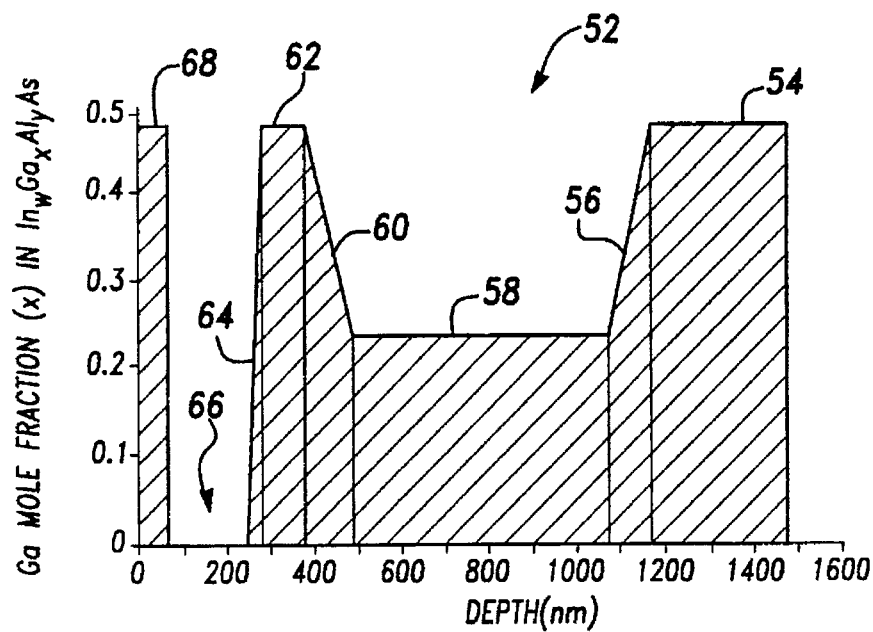
FIG. 5 is a graph of the Ga mole fraction content of each layer of the HBT of FIG. 1.

FIG. 5 shows a graph of the Ga mole fraction content of each layer discussed above with reference to the HBT 10 of FIG. 1. The Ga mole fraction content is given on the vertical axis and each layer of the HBT 10 is represented in nanometers (nm) from the top surface of the emitter contact layer 34 along the horizontal axis from left to right. In this configuration, a region 54 represents the subcollector layer 14 as having a Ga mole fraction content of 47%. A graded region 56 represents the graded collector layer 18 and a region 58 represents the collector layer 20. The region 56 has a Ga mole fraction content of about 47% adjacent the region 54 and is gradually graded so that the Ga mole fraction content is about 24% at an interface between the region 56 and the region 58. A graded region 60 represents the graded collector layer 22 and a region 62 represents the base layer 24. The graded region 60 has a Ga mole fraction content of about 24% at an interface with the region 58 and is gradually graded so that the mole fraction content of Ga at the interface of the region 60 and the region 62 is about 47%. A graded region 64 represents the graded emitter-base transition layer 28 and a region 66 represents the emitter contact layer 34. The graded region 64 has a Ga mole fraction content of about 47% at an interface between the region 64 and the region 62, and is graded to about 0% Ga at an interface between the region 64 and a region 66 that represents the emitter layer 30. A region 68 represents the combination of the emitter contact layers 32 and 34 as having a Ga content of 48%.

Figure 6:
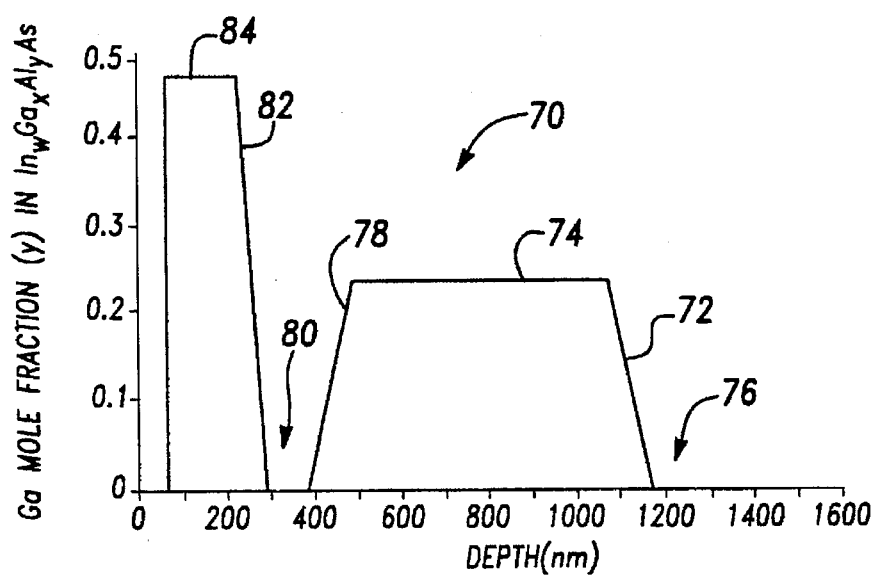
FIG. 6 is a graph of the Al mole fraction content of each layer of the HBT of FIG. 1.

FIG. 6 is a graph showing the Al mole fraction content for each layer of the HBT 10 of FIG. 1. As above, the mole fraction content is given on the vertical axis and each layer of the HBT is represented in nanometers (nm) on the vertical axis. A graded region 72 represents the graded collector layer 18 and a region 74 represents the collector layer 20. The aluminum mole fraction content of the region 72 is about 23% at an interface between the graded region 72 and the region 74, and is gradually graded to about 0% Al at a region 76 representing the subcollector layer 14. Likewise, a graded region 78 represents the graded collector layer 22 and a region 80 represents the base layer 24. The aluminum mole fraction content of the graded region 78 is about 23% at an interface between the graded region 78 and the region 74, and is gradually graded to about 0% aluminum at the region 80. A graded region 82 represents the graded emitter-base transition region 28 and a region 84 represents the emitter layer 30. The graded region 82 has an aluminum mole fraction content of about 48% at an interface between the region 84 and the graded region 82, and is gradually graded to about 0% aluminum at an interface between the graded region 82 and the region 80.

Figure 7:
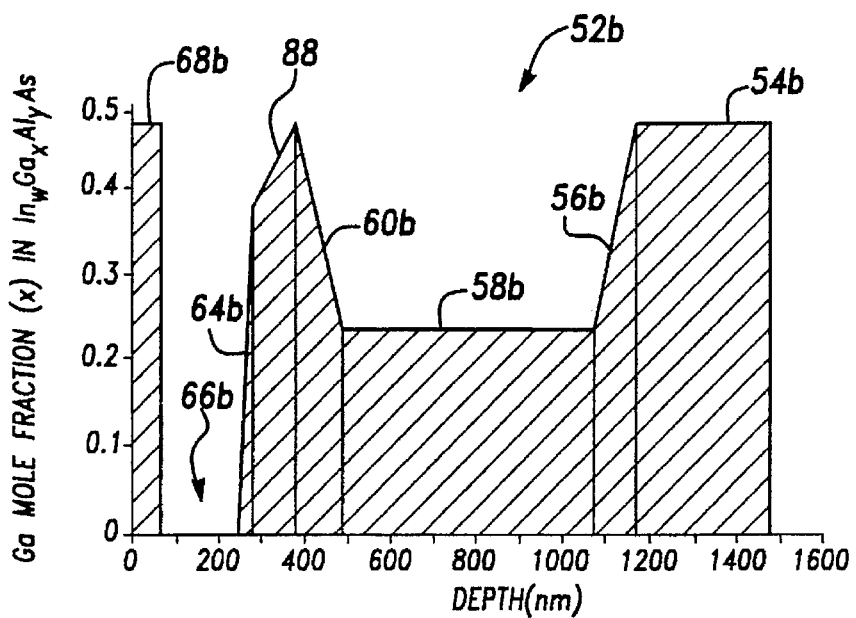
FIG. 7 is a graph of the Ga mole fraction content of each layer of the HBT of FIG. 3.

FIG. 7 shows a graph 52b that depicts the Ga mole fraction content in the layers of the HBT 10b of FIG. 3. The graph of FIG. 7 is substantially the same as the graph 52 of FIG. 5, so therefore like regions of the graph 52b are labeled the same as the regions in the graph 52 followed by the letter "b". The difference between the graph 52b and the graph 52 is that the region 62 has been replaced with a graded region 88 to represent the graded-composition base layer 42. The graded region 88 has a Ga mole fraction content of about 47% at an interface between the graded region 60b and the graded region 88, and is graded so that the content of the Ga in the graded region 84 is about 24% at an interface between the graded region 84 and the graded region 64b.

Figure 8:
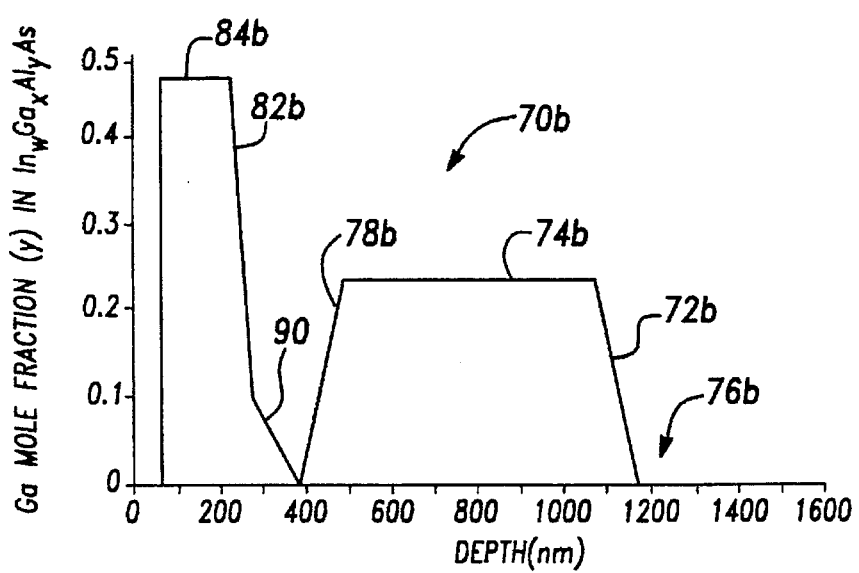
FIG. 8 is a graph of the Al mole fraction content of each layer of the HBT of FIG. 3.

FIG. 8 shows a graph 70b of the aluminum mole fraction content of the HBT 10b of FIG. 3. The graph 70b is almost identical to that of the graph 70 of FIG. 6 and therefore like regions of the graph 70b to that of the graph 70 are labeled accordingly and followed by the letter "b". The difference between the graph 70b and the graph 70 is that a new region 90 has been added to represent the graded composition of the base layer 42. The region 90 has an aluminum mole fraction content of about 0% at an interface between the region 90 and the region 78b and an aluminum mole fraction content of about 25% at an interface between the region 90 and the region 82b.

Figure 9:
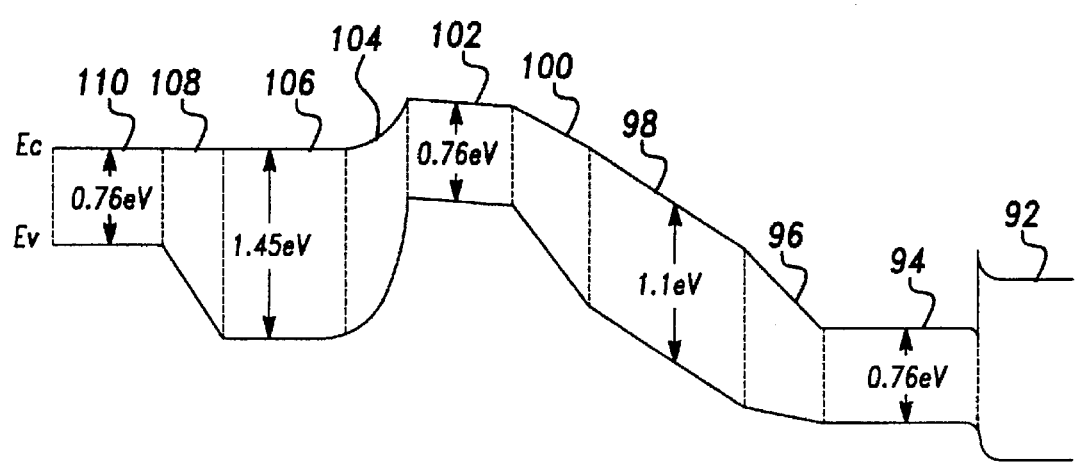
FIG. 9 is a bandgap diagram of the HBT of FIG. 2.

FIG. 9 shows a bandgap diagram of the bandgaps of the different layers of the HBT 10a of FIG. 2. Each of the different layers are shown being separated by a dotted vertical line. The energy between the conduction band ($E_c$) and the valence band ($E_v$) is given in electron volts (eV) for each layer that is not a graded composition layer. The substrate 12a is represented as a bandgap region 92. The subcollector layer 14a is represented as a bandgap region 94. The graded collector layer 18a is represented as a bandgap region 96. The collector layer 20 is represented as a bandgap region 98. The graded collector layer 22a is represented as a bandgap region 100. The graded-doping base layer 40 is represented as a bandgap region 102. The emitter-base transition layer 28a is represented as a bandgap region 104. The emitter layer 30a is represented as a bandgap region 106. The emitter contact layer 32a is represented as a bandgap region 108. And, the emitter contact layer 34a is represented as a bandgap region 110.

Figure 10:
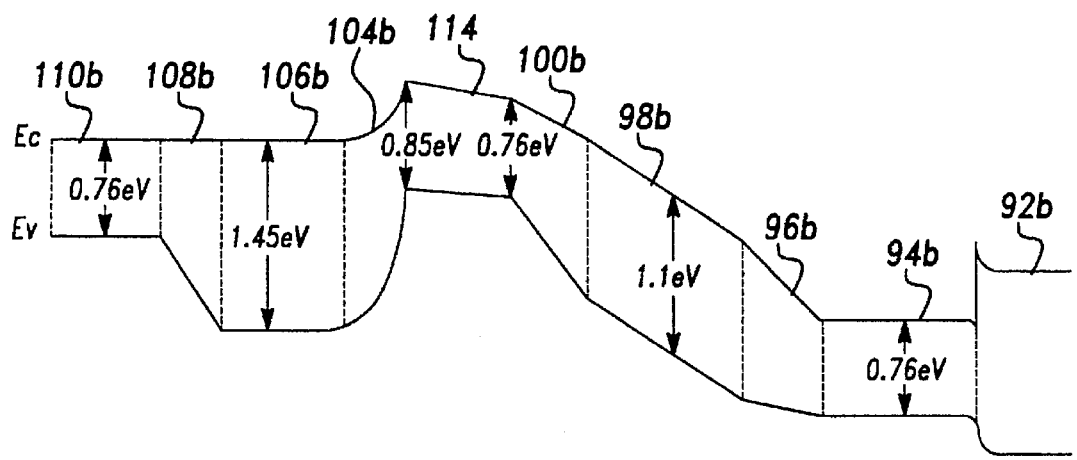
FIG. 10 is a bandgap diagram of the HBT of FIG. 3.

FIG. 10 shows a bandgap diagram of the bandgaps of the different layers of the HBT 10b of FIG. 3. The graded-composition based layer 42 is represented by a bandgap region 114. The other bandgap regions of FIG. 10 are the same as the bandgap regions of FIG. 9, and therefore, like bandgap regions to those of the bandgap regions of FIG. 9 are represented by the same reference numeral followed by the letter "a". As is apparent, however, the bandgap energy level of the bandgap region 114 is 0.85eV adjacent to the bandgap region 104a, and gradually decreases to a bandgap energy level of 0.76eV at an interface between the bandgap region 114 and the bandgap region 100a. It is the gradual increase in the bandgap energy level across the bandgap region 114 that creates a built-in electric field that allows for an increase in the base-transit time of the electron in the HBT 10b.

Figure 11A:
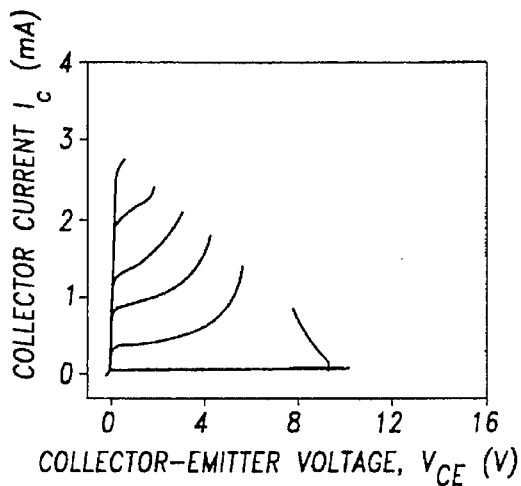
FIGS. 11(a) and 11(b) show a graph of collector current ($I_c$) in the vertical axis versus collector-emitter voltage ($V_{CE}$) in the horizontal axis depicting breakdown voltage for an InGaAs collector and an InGaAlAs collector, respectively.
Figure 11B:
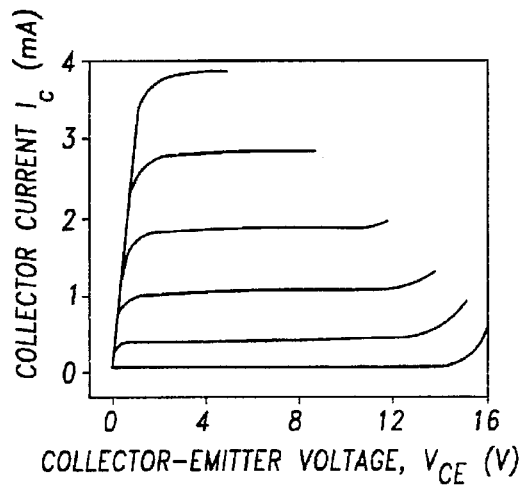

FIGS. 11(a) and 11(b) show the collector current $I_c$ in the vertical axis and the collector-emitter voltage $V_{CE}$ in the horizontal axis that depict the breakdown voltage $V_{BE}$ for a prior art InGaAs collector HBT and an InGaAlAs collector HBT for an HBT of the present invention, respectively, of an HBT having a 3×10 μm² emitter. As is apparent, the prior art HBT in FIG. 11(a) has a breakdown voltage of approximately 10v. The HBT of the present invention shown in FIG. 11(b) has a breakdown voltage of about 16v.

Figure 12:
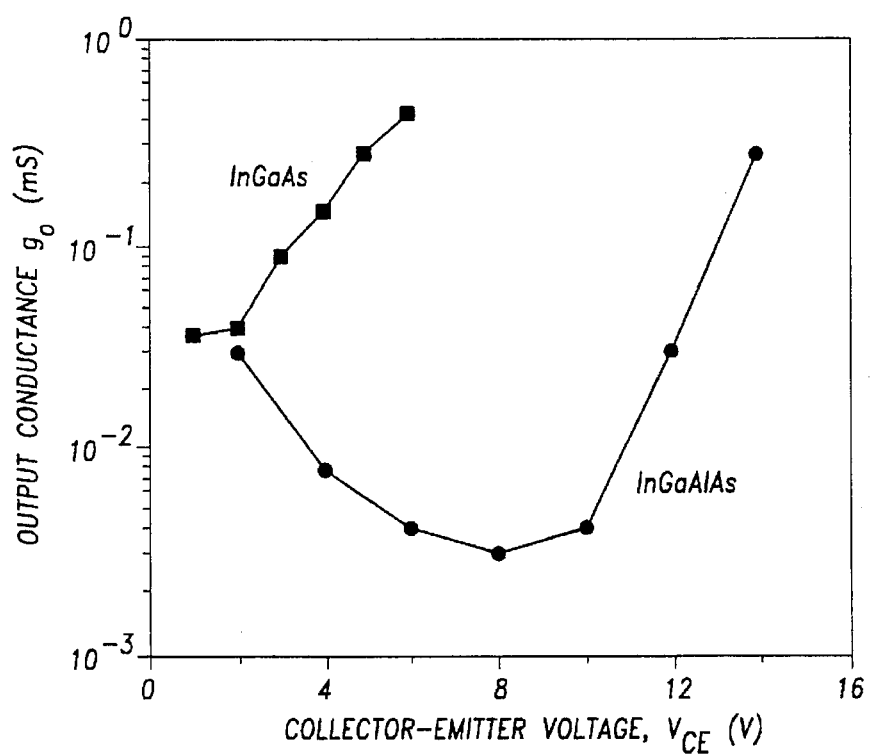
FIG. 12 i a graph of output conductance ($g_o$) in the vertical axis and collector-emitter voltage ($V_{CE}$) in the horizontal axis for an InGaAs collector and an InGaAlAs collector.

FIG. 12 shows a graph of output conductance $g_o$ in the vertical axis and collector-emitter voltage $V_{CE}$ in the horizontal axis that depicts the output conductance of an HBT of the prior art having an InGa/InGaAs collector and an HBT of the present invention having an InGaAlAs collector. As is apparent, the output conductance $g_o$ is significantly less for the HBT of the present invention as opposed to the prior art HBT.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A semiconductor device comprising:

a substrate;

an InGaAlAs collector layer positioned on the substrate, said collector layer having a substantially constant composition of InGaAlAs;

a base layer positioned on the collector layer;

a first graded InGaAlAs layer positioned between the collector layer and the substrate and a second InGaAlAs graded layer positioned between the collector layer and the base layer, wherein the first and second graded layers include graded aluminum such that the concentration of aluminum of the first graded layer at a surface of the first graded layer opposite to the collector layer is substantially zero and the concentration of aluminum of the first graded layer at a surface of the first graded layer adjacent to the collector layer is substantially the same as the concentration of aluminum in the collector layer, and wherein the concentration of aluminum of the second graded layer at a surface of the second graded layer adjacent to the base layer is nearly zero and the concentration of aluminum of the second graded layer at a surface of the second graded layer adjacent to the collector layer is substantially the same as the concentration of aluminum in the collector layer;

a graded InGaAlAs emitter-base transition layer positioned on the base layer; and an emitter layer positioned on the emitter-base transition layer, wherein the graded transition layer has a graded composition so as to have substantially the same composition as the base layer at a surface adjacent to the base layer and substantially the same composition as the emitter layer at a surface adjacent to the emitter layer.

2. The semiconductor device according to claim 1 wherein the collector layer is approximately 600 nm thick and has an n-type doping of approximately $9\times10^{15}$ atoms/cm³ and the first and second graded layers are approximately 100 nm thick and have an n-type doping of approximately $1\times10^{19}$ atoms/cm³.

3. The semiconductor device according to claim 1 wherein the base layer is a graded doping base layer including a p-type doping profile having a first doping concentration at a surface of the base layer closest to the collector layer and a second doping concentration at a surface of the base layer proximate to the emitter-base transition layer, wherein the base layer doping profile is graded so that the first doping concentration is less than the second doping concentration.

4. The semiconductor device according to claim 3 wherein the first doping concentration is approximately $1\times10^{19}$ atoms/cm³ and the second doping concentration is approximately $4\times10^{19}$ atoms/cm³.

5. The semiconductor device according to claim 3 wherein the base layer is an InGaAs base layer.

6. The semiconductor device according to claim 3 wherein the base layer is an InGaAlAs base layer.

7. The semiconductor device according to claim 6 wherein the base layer is a graded-composition InGaAlAs base layer such that the composition of the base layer is substantially the same as the emitter-base transition layer at an interface between the base layer and the transition layer and the composition of the base layer is substantially the same as the second graded layer at an interface between the base layer and the second graded layer.

8. The semiconductor device according to claim 1 wherein the base layer is a graded-composition InGaAlAs base layer such that the composition of the base layer is substantially the same as the emitter-base transition layer at an interface between the base layer and the transition layer and the composition of the base layer is substantially the same as the second graded layer at an interface between the base layer and the second graded layer.

9. The semiconductor device according to claim 1 wherein the emitter layer is an InAlAs emitter layer.

10. The semiconductor device according to claim 1 wherein the substrate is an InP substrate.

11. The semiconductor device according to claim 1 wherein the emitter-base transition layer has an n-type doping concentration of approximately $5\times10^{17}$ atoms/cm³ and a thickness of approximately 45 nm.

12. A semiconductor device comprising:

a substrate;

an InGaAlAs collector layer positioned on the substrate, said collector layer having a substantially constant composition of InGaAlAs;

a base layer positioned on the collector layer, said base layer including a p-type graded doping profile having a first doping concentration at a surface of the base layer closest to the collector layer and a second doping concentration at a surface of the base layer proximate to an emitter layer, wherein the base layer doping profile is graded so that the first doping concentration is less than the second doping concentration; and a first graded InGaAlAs layer positioned between the collector layer and the substrate and a second InGaAlAs graded layer positioned between the collector layer and the base layer, wherein the first and second graded layers include graded aluminum such that the concentration of aluminum of the first graded layer at a surface of the first graded layer opposite to the collector layer is substantially zero and the concentration of aluminum of the first graded layer at a surface of the first graded layer adjacent to the collector layer is substantially the same as the concentration of aluminum in the collector layer, and wherein the concentration of aluminum of the second graded layer at a surface of the second graded layer adjacent to the base layer is nearly zero and the concentration of aluminum of the second graded layer at a surface of the second graded layer adjacent to the collector layer is substantially the same as the concentration of aluminum in the collector layer.

13. The semiconductor device according to claim 12 wherein the base layer is an InGaAs base layer.

14. The semiconductor device according to claim 12 wherein the base layer is an InGaAlAs base layer.

15. The semiconductor device according to claim 14 wherein the InGaAlAs base layer has a graded composition such that the concentration of Ga closest to the collector layer is the highest and the concentration of Ga closest to the emitter layer is the lowest, and the concentration of Al closest to the collector layer is the lowest and the concentration of Al closest to the emitter layer is the highest.

16. A semiconductor device comprising:

a substrate;

an InGaAlAs collector layer positioned on the substrate;

an InGaAlAs base layer positioned on the collector layer; and an InAlAs emitter layer positioned on the base layer, wherein the base layer is a graded composition base layer such that the base layer has its highest concentration of Ga closest to the collector layer and has its lowest concentration of Ga closest to the emitter layer and its lowest concentration of Al closest to the collector layer and its highest concentration of Al closest to the emitter layer.

17. The semiconductor device according to claim 16 wherein the collector layer has a substantially constant composition of InGaAlAs, said semiconductor device further comprising a first graded InGaAlAs layer positioned between the collector layer and the substrate and a second InGaAlAs graded layer positioned between the collector layer and the base layer, wherein the first and second graded layers include graded aluminum such that the concentration of aluminum of the first graded layer at a surface of the first graded layer opposite to the collector layer is substantially zero and the concentration of aluminum of the first graded layer at a surface of the first graded layer adjacent to the collector layer is substantially the same as the concentration of aluminum in the collector layer, and wherein the concentration of aluminum of the second graded layer at a surface of the second graded layer adjacent to the base layer is substantially zero and the concentration of aluminum of the second graded layer at a surface of the second graded layer adjacent to the collector layer is substantially the same as the concentration of aluminum in the collector layer.

* * * * *